(12) United States Patent
Staudinger

(10) Patent No.: US 9,391,572 B2
(45) Date of Patent: Jul. 12, 2016

(54) DRIVER AMPLIFIER SYSTEMS AND METHODS OF THEIR OPERATION

(71) Applicant: Freescale Semiconductor, Inc., Austin, TX (US)

(72) Inventor: Joseph Staudinger, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 46 days.

(21) Appl. No.: 14/300,701

(22) Filed: Jun. 10, 2014

(65) Prior Publication Data

US 2015/0357976 A1  Dec. 10, 2015

(51) Int. Cl.

| | |
|---|---|
| *H03F 3/68* | (2006.01) |
| *H03F 3/72* | (2006.01) |
| *H03F 1/02* | (2006.01) |
| *H03F 3/193* | (2006.01) |
| *H03F 3/21* | (2006.01) |
| *H03F 3/217* | (2006.01) |
| *H03F 3/345* | (2006.01) |

(52) U.S. Cl.
CPC ............... *H03F 3/72* (2013.01); *H03F 1/0261* (2013.01); *H03F 3/193* (2013.01); *H03F 3/211* (2013.01); *H03F 3/2171* (2013.01); *H03F 3/2175* (2013.01); *H03F 3/345* (2013.01); *H03F 2200/36* (2013.01); *H03F 2200/451* (2013.01); *H03F 2200/537* (2013.01); *H03F 2203/21151* (2013.01)

(58) Field of Classification Search
CPC ........... H03F 1/0211; H03F 3/19; H03F 3/72; H03F 3/217; H03F 3/2178; H03F 2200/451; H03F 2200/36; H03F 1/02; H03F 1/0261; H03F 3/193; H03F 3/2171; H03F 3/2175; H03F 3/345; H03F 3/211; H03F 2203/21151; H03F 2200/537
USPC ................... 330/262–264, 267, 269, 273, 295
See application file for complete search history.

(56) References Cited

U.S. PATENT DOCUMENTS

| | | | |
|---|---|---|---|
| 3,986,134 A | 10/1976 | Yokoyama | |
| 7,843,270 B2 * | 11/2010 | Li et al. | 330/295 |
| 8,264,282 B1 * | 9/2012 | Riekki et al. | 330/302 |
| 2002/0158675 A1 | 10/2002 | Hohn et al. | |

FOREIGN PATENT DOCUMENTS

| | | |
|---|---|---|
| EP | 2882099 A1 | 6/2015 |
| EP | 2882100 A1 | 6/2015 |

OTHER PUBLICATIONS

"MOSFET Push-Pull Buffer/Amplifier", printed from the Journal of Tube Audio Circuit Design, http://www.tubecad.com/index_files/page0021, Mar. 21, 2003 (3 pages).

* cited by examiner

*Primary Examiner* — Khanh V Nguyen

(57) ABSTRACT

The embodiments described herein provide a radio frequency (RF) driver amplifier and method of operation. In general, the driver amplifier facilitates high performance operation in RF devices while being implemented with only n-type transistors. Using only n-type transistors in the driver amplifier can increase the operating bandwidth of the driver amplifier. Furthermore, using only n-type transistors in the driver amplifier can simplify device fabrication. The driver amplifiers and methods described herein can be used in a variety of applications. As one specific example the driver amplifier can be used in a switch-mode power amplifier (SMPA). Such a SMPA can be configured to amplify a time varying signal, such as an RF.

20 Claims, 7 Drawing Sheets

DRIVER AMPLIFIER SYSTEMS AND METHODS OF THEIR OPERATION

TECHNICAL FIELD

Embodiments relate generally to driver amplifiers and methods of their operation.

BACKGROUND

Driver amplifiers are used in a wide variety of applications. In general, driver amplifiers are used to increase the power of signals. For example, driver amplifiers can be used to convert low-power radio frequency (RF) signals into larger RF signals for driving the antenna of a transmitter. In such cases, driver amplifiers may be implemented as part of overall power amplifier used by an RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

However, amplifier performance also is important to consider, and many amplifier designs with high theoretical efficiencies may have characteristically lower performance. For example, some classes of amplifiers having relatively high theoretical efficiencies may have relatively poor performance in terms of linearity, distortion, bandwidth, and so on.

As there is a great desire to optimize both efficiency and performance in an RF power amplifier, designers of RF power amplifiers continue to strive to develop more efficient and higher performing amplifier designs.

DETAILED DESCRIPTION

Figure 1:
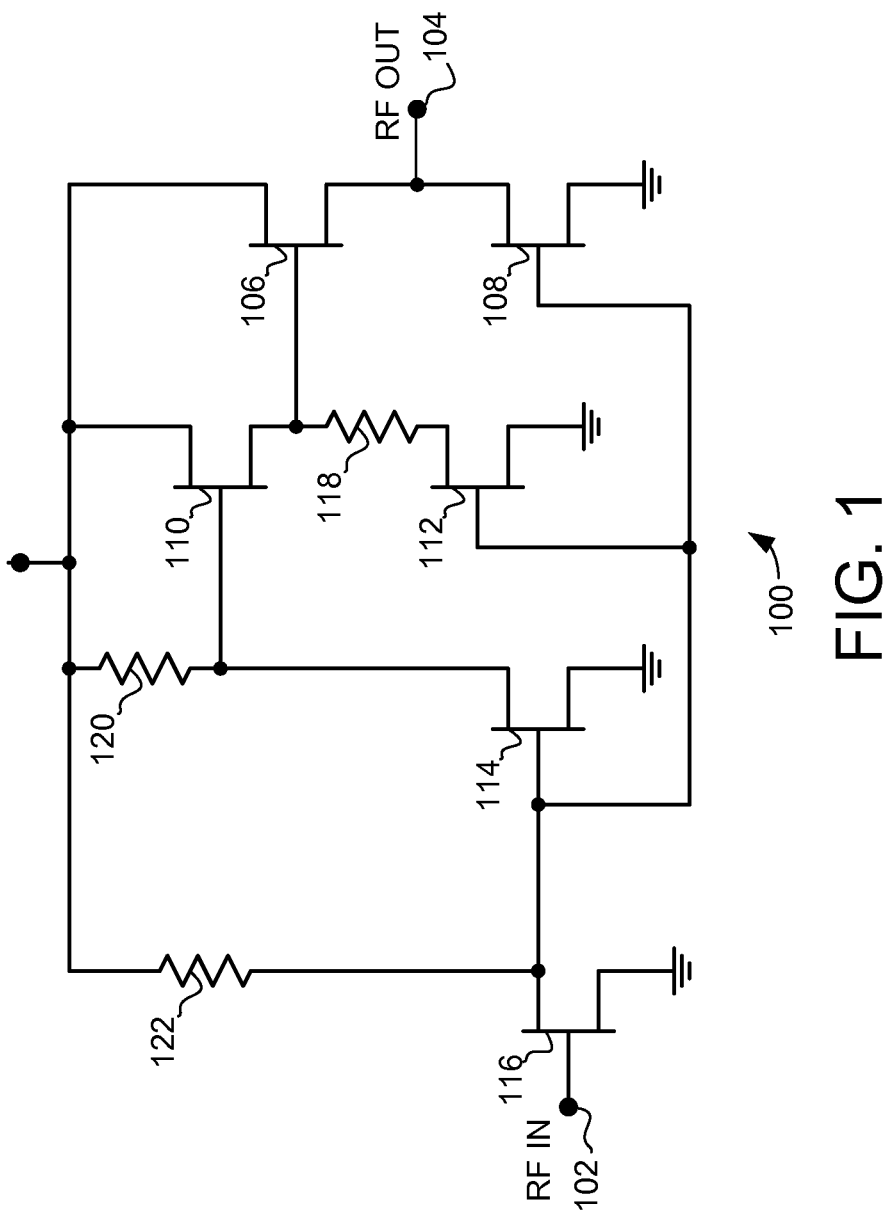
FIG. 1 a circuit diagram of a driver amplifier in accordance with a first example embodiment.

The embodiments described herein provide a radio frequency (RF) driver amplifier and method of operation. In general, the driver amplifier facilitates high performance operation in RF devices while being implemented with only n-type transistors. Using only n-type transistors in the driver amplifier can increase the operating bandwidth of the driver amplifier. Furthermore, using only n-type transistors in the driver amplifier can simplify device fabrication.

The driver amplifiers and methods described herein may be used in a variety of applications. As one specific example the driver amplifier can be used in a switch-mode power amplifier (SMPA). Such a SMPA can be configured to amplify a time varying signal, such as a RF signal. In one specific embodiment the SMPA implements an RF digital-to-analog converter (DAC) function. Such an implementation can be used in communication systems where an RF signal is oversampled and quantized and used to drive multiple parallel SMPA branches.

In one embodiment, a driver amplifier includes an input node coupled to an RF signal, an output node, a first transistor pair and a second transistor pair. The first transistor pair includes a first transistor in series with a second transistor, and the second transistor pair includes a third transistor in series with a fourth transistor. Each of the first, second, third and fourth transistors are an n-type transistor having a gate, source and drain.

Specifically, the first transistor is an n-type transistor having a first gate, first source, and first drain, the second transistor is an n-type transistor having a second gate, second source, and second drain, the third transistor is an n-type transistor having a third gate, third source and third drain, and the fourth transistor is an n-type transistor having a fourth gate, fourth source and fourth drain. The output node of the driver amplifier is coupled to the first source, and the second drain, while the input node is coupled to the second gate, third and gate and fourth gate, and where the first gate is coupled to the third source.

So configured the driver amplifier includes two n-type transistor pairs arranged in a push-pull configuration. This push-pull configuration allows the driver amplifier to alternatively supply current and absorb current from a load at the output without requiring any p-type transistors. Eliminating the need for p-type transistors can improve the high frequency bandwidth of the driver amplifier and its associated devices. This is particularly true in gallium arsenide (GaAs) implemented devices where n-type devices typically have a much high frequency performance compared to p-type devices.

Furthermore, in some embodiments, the driver amplifier is configured to facilitate level shifting at the output. This can allow the use of the driver amplifier with a variety of different loads, including using the driver amplifier to drive gallium nitride (GaN) transistors that typically have negative threshold voltages. Again, such a device can provide improved high frequency performance.

Turning now to FIG. 1, a driver amplifier 100 in accordance with an exemplary embodiment is illustrated schematically. The driver amplifier 100 includes an input node 102 configured to be coupled to an RF signal, an output node 104, a first transistor 106, a second transistor 108, a third transistor 110, a fourth transistor 112, a fifth transistor 114, a sixth transistor 116, a first resistor 118, a second resistor 120, and a third resistor 122. The transistors 106 and 108 are arranged in series as and include a first transistor pair, and likewise transistors 110 and 112 are arranged in series and include a second transistor pair. Each of the first transistor 106, second transistor 108, third transistor 110, fourth transistor 112, fifth transistor 114 and sixth transistor 116 includes a n-type transistor having a gate, source, and drain. Furthermore, each of the first transistor 106, second transistor 108, third transistor 110, fourth transistor 112, fifth transistor 114 and sixth transistor 116 include enhancement mode devices.

Specifically, the first transistor 106 is an n-type transistor having a first gate, first source and first drain, the second transistor 108 is an n-type transistor having a second gate, second source and second drain, the third transistor 110 is an n-type transistor having a third gate, third source and third drain, the fourth transistor 112 is an n-type transistor having a fourth gate, fourth source and fourth drain, the fifth transistor 114 is an n-type transistor having a fifth gate, fifth source and fifth drain, the sixth transistor 116 is an n-type transistor having a sixth gate, sixth source, and sixth drain.

The output node 104 of the driver amplifier is coupled to the first source and the second drain. The input node 102 coupled to the second gate, third gate, and fourth gate through the fifth transistor 114 and sixth transistor 116. Specifically, the input node 102 is coupled to the sixth gate, the sixth drain is coupled to the fifth gate, the fourth gate, and the second gate, while the fifth drain is coupled to the third gate.

So configured the driver amplifier 100 includes two n-type transistor pairs arranged in a push-pull configuration. This push-pull configuration allows the driver amplifier 100 to alternatively supply current and absorb current from a load at the output 104 without requiring any p-type transistors.

In general, the transistors in driver amplifier 100 are operated in a switch-mode operation. This is, following a transition period, the transistors are either ON or OFF depending on the instantaneous value of the voltage at the input node 104. Specifically, the voltage on the drain of the sixth transistor 116 determines the states of the second transistor 108, the fourth transistor 112, and the fifth transistor 114. Furthermore, when the fifth transistor 114 is turned ON, the third transistor 110 is OFF, the fourth transistor 112 is ON, the third transistor 110 is OFF, the first transistor 106 is OFF, and the second transistor 108 is ON. This action results in the output node 104 being driven low. Conversely, when the fifth transistor 114 is OFF, the third transistor 110 is ON, the fourth transistor 112 is OFF, the third transistor 110 is ON, the first transistor 106 is ON, and the second transistor 108 is OFF. This action results in the output node 104 being driven high.

Thus, when an RF signal is applied to the input node 102, the gate of the sixth transistor 116 is modulated to drive the gates of the second transistor 108, the fourth transistor 112, and the fifth transistor 114. In response, the fifth transistor 114 drives the gate of the third transistor 110. Thus, the fifth transistor 114 and sixth transistor 116 together drive the two transistor pairs in response to an RF signal at the input node 102.

Specifically, the third transistor 110 is driven by the drain of the fifth transistor 114 to turn on the first transistor 106 during positive swings of the RF signal at the input node 102. The fourth transistor 112 is likewise driven by the drain of the sixth transistor 116 to turn off first transistor 106 during negative swings. In response, the first transistor 106 is driven to supply current to a load at the output 104 during the positive swings, while the second transistor 108 is driven to absorb current from the load at the output 104 during negative swings.

During this operation, the first resistor 118 provides a damping function to limit current flow through the third transistor 110 and fourth transistor 112 during time periods when both transistors might be on at the same time. The second resistor 120 and the third resistor 122 are pull-up resistors.

In typical implementations the transistors are sized with the transistors nearer the output node 104 being the largest. Thus, the first transistor 106 and the second transistor 108 would be the largest, with the other transistors smaller and sized appropriately to drive the transistors closer to the output node 104.

Figure 2:
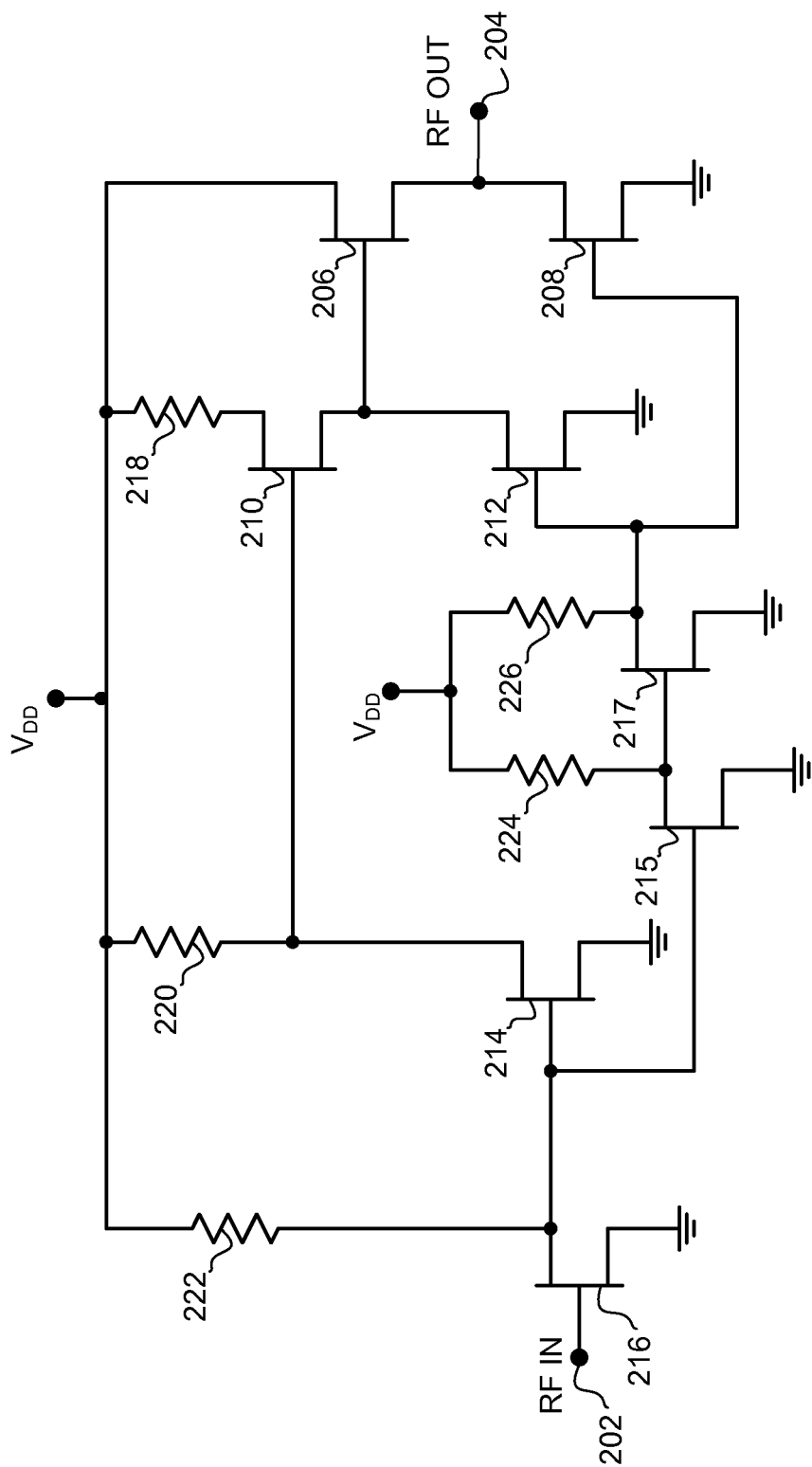
FIG. 2 a circuit diagram of a driver amplifier in accordance with a second example embodiment.

Turning now to FIG. 2, a driver amplifier 200 in accordance with another exemplary embodiment is illustrated schematically. In general, the driver amplifier 200 operates similarly to driver amplifier 100 but adds additional transistors to balance the delay to the transistor pairs.

Specifically, the driver amplifier 200 includes an input node 202 configured to be coupled to an RF signal, an output node 204, a first transistor 206, a second transistor 208, a third transistor 210, a fourth transistor 212, a fifth transistor 214 a sixth transistor 216, a seventh transistor 215, an eighth transistor 217, a first resistor 218, a second resistor 220, a third resistor 222, a fourth resistor 224 and a fifth resistor 226. Again, the transistors 206 and 208 are arranged in series as and include a first transistor pair, and likewise transistors 210 and 212 are arranged in series and include a second transistor pair. Each of the transistors includes an enhancement mode, n-type transistor having a gate, source and drain.

In this embodiment, input node 202 is coupled to the second gate, third gate and fourth gate through the fifth transistor 214, sixth transistor 216, seventh transistor 215, and eighth transistor 217. Specifically, the input node 202 is coupled to the sixth gate, and the sixth drain is coupled to the fifth gate and the seventh gate. The seventh drain is connected to the eighth gate, and the eighth drain is coupled to the fourth gate and the second gate. The fifth drain is coupled to the third gate. The seventh transistor 215 and eighth transistor 217 in this embodiment can add a delay that matches the delay added by the fifth transistor 214. This matching of the delay can reduce the time that the first transistor 206 and second transistor 208 are both ON or both OFF. This can improve the power efficiency and frequency response of the driver amplifier 200.

Similar to the embodiment described above, the driver amplifier 200 includes two n-type transistor pairs arranged in a push-pull configuration. This push-pull configuration allows the driver amplifier 200 to alternatively supply current and absorb current from a load at the output 204 without requiring any p-type transistors.

Figure 3:
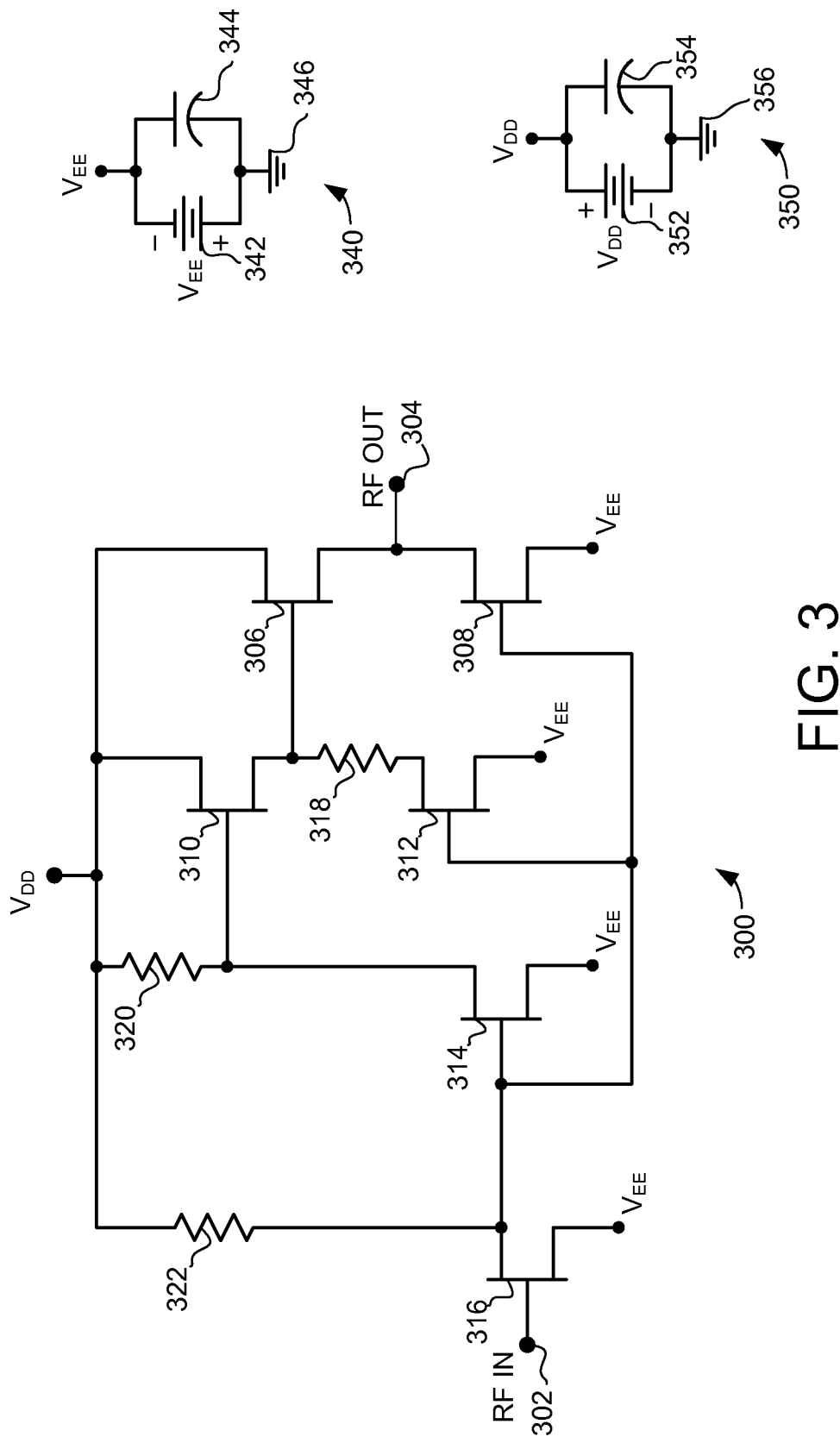
FIG. 3 a circuit diagram of a driver amplifier in accordance with a third example embodiment.

Turning now to FIG. 3, a driver amplifier 300 in accordance with a third exemplary embodiment is illustrated schematically. In general, the driver amplifier 300 operates similarly to driver amplifier 100 but adds bias circuits to provide output level shifting. Such output level shifting can be used to facilitate different types of output loads. For example, the use of output level shifting can facilitate the use of transistors with negative threshold voltages.

The driver amplifier 300 includes an input node 302 configured to be coupled to an RF signal, an output node 304, a first transistor 306, a second transistor 308, a third transistor 310, a fourth transistor 312, a fifth transistor 314 a sixth transistor 316, a first resistor 318, a second resistor 320, and a third resistor 322. The transistors 306 and 308 are arranged in series and include a first transistor pair, and likewise, transistors 310 and 312 are arranged in series and include a second transistor pair. Each of the first transistor 306, second transistor 308, third transistor 310, fourth transistor 312, fifth transistor 314, and sixth transistor 316 is a n-type transistor having a gate, source and drain.

To facilitate level shifting at the output node 304 the second transistor 308, the fourth transistor 312, the fifth transistor 314, and the sixth transistor 316 are each coupled to a bias element 340. The bias element 340 includes voltage source 342 and a decoupling capacitor 344, coupled in parallel to a ground 346. The bias element 340 provides a ground level bias at RF, but provides a negative voltage bias of $V_{EE}$ at DC. So configured, the negative voltage bias of $V_{EE}$ shifts the DC level of the output.

Such output level shifting can be used to facilitate different types of output loads, including the use of transistors with negative threshold voltages in the output load. As one specific example, the output level shifting can be used to facilitate the driving of GaN transistors with the driver amplifier 300. GaN transistors are commonly high performance devices that employ negative threshold voltages. Thus, the level shifting provided by amplifier 300 facilitates the use of high performance output transistors and can thus be used to provide improved high frequency performance.

In this illustrated embodiment the bias voltage $V_{DD}$ is provided by a bias element 350. The bias element 350 includes voltage source 352 and a decoupling capacitor 354, coupled in parallel to a ground 356. The bias element 350 provides a positive voltage bias of $V_{DD}$ at DC. So configured, the bias element 350 decouples the DC bias voltage of $V_{DD}$ and presents a near ideal zero ohm impedance to all RF signals at the $V_{DD}$ node.

Figure 4:
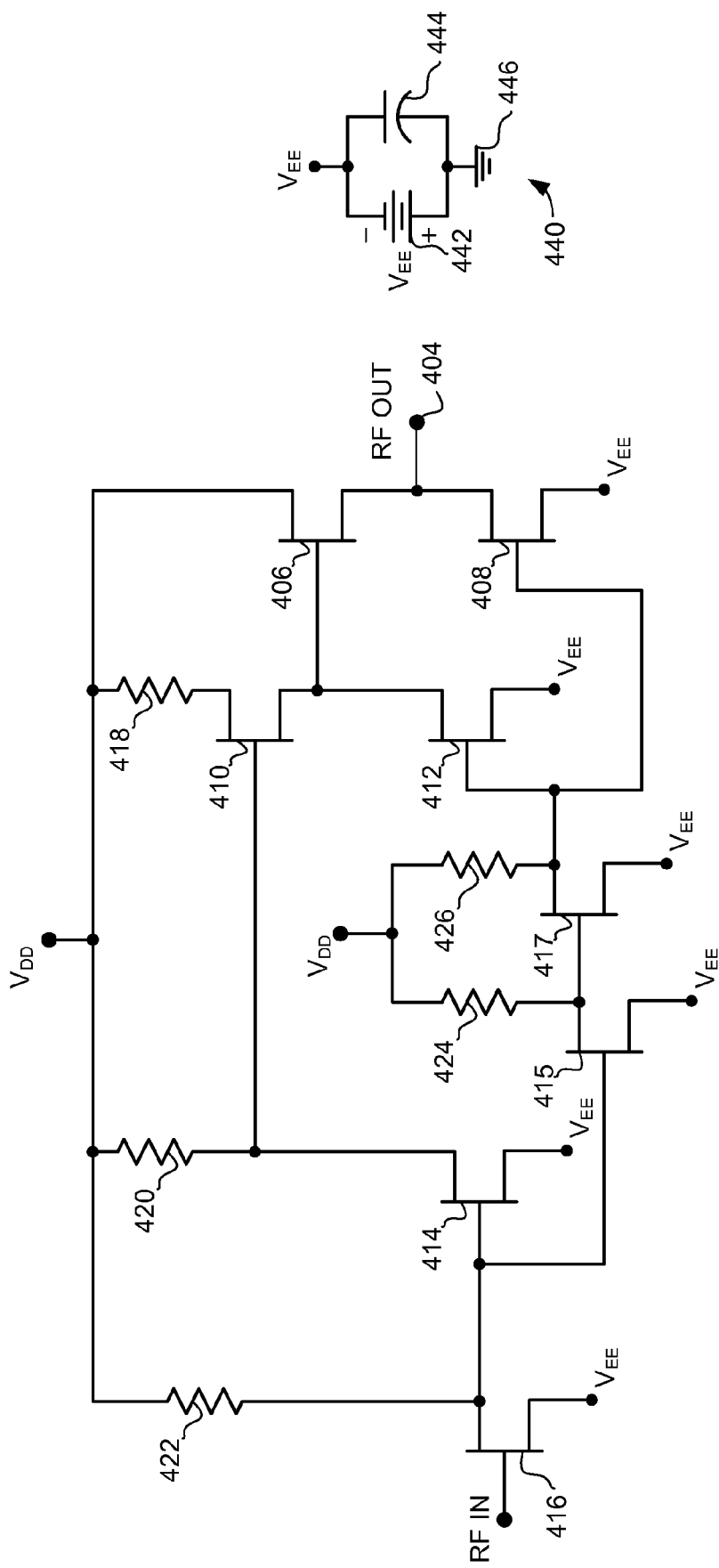
FIG. 4 a circuit diagram of a driver amplifier in accordance with a fourth example embodiment.

Turning now to FIG. 4, a driver amplifier 400 in accordance with another exemplary embodiment is illustrated schematically. In general, the driver amplifier 400 operates similarly to driver amplifier 100 but adds both output level shifting and additional transistors to balance the delay to the transistor pairs.

Specifically, the driver amplifier 400 includes an input node 402 configured to be coupled to an RF signal, an output node 404, a first transistor 406, a second transistor 408, a third transistor 410, a fourth transistor 412, a fifth transistor 414 a sixth transistor 416, a seventh transistor 415, an eighth transistor 417, a first resistor 418, a second resistor 420, a third resistor 422, a fourth resistor 424 and a fifth resistor 426. The transistors 406 and 408 are arranged in series as and include a first transistor pair, and likewise transistors 410 and 412 are arranged in series and include a second transistor pair, and each of the transistors includes an enhancement mode, n-type transistor having a gate, source and drain.

Like the embodiment of FIG. 2, the seventh transistor 415 and eighth transistor 417 in this embodiment can add a delay that matches the delay added by the fifth transistor 414. To facilitate level shifting, the second transistor 408, the fourth transistor 412, the fifth transistor 414, the sixth transistor 416, the seventh transistor 415 and the eighth transistor 417 are each coupled to a bias element 440. The bias element 440 includes voltage source 442 and a decoupling capacitor 444, coupled in parallel to a ground 446. The bias element 440 provides a negative voltage bias of $V_{EE}$ at DC. So configured, the bias element 340 decouples the DC bias voltage of $V_{EE}$ and presents a near ideal zero ohm impedance to all RF signals at the VEE node. The output level shifting can be used to facilitate different types of output loads, including the use of transistors with negative threshold voltages in the output load.

Like the previous embodiments the driver amplifier 400 includes two n-type transistor pairs arranged in a push-pull configuration. This push-pull configuration allows the driver amplifier 400 to alternatively supply current and absorb current from a load at the output 404 without requiring any p-type transistors.

Figure 5:
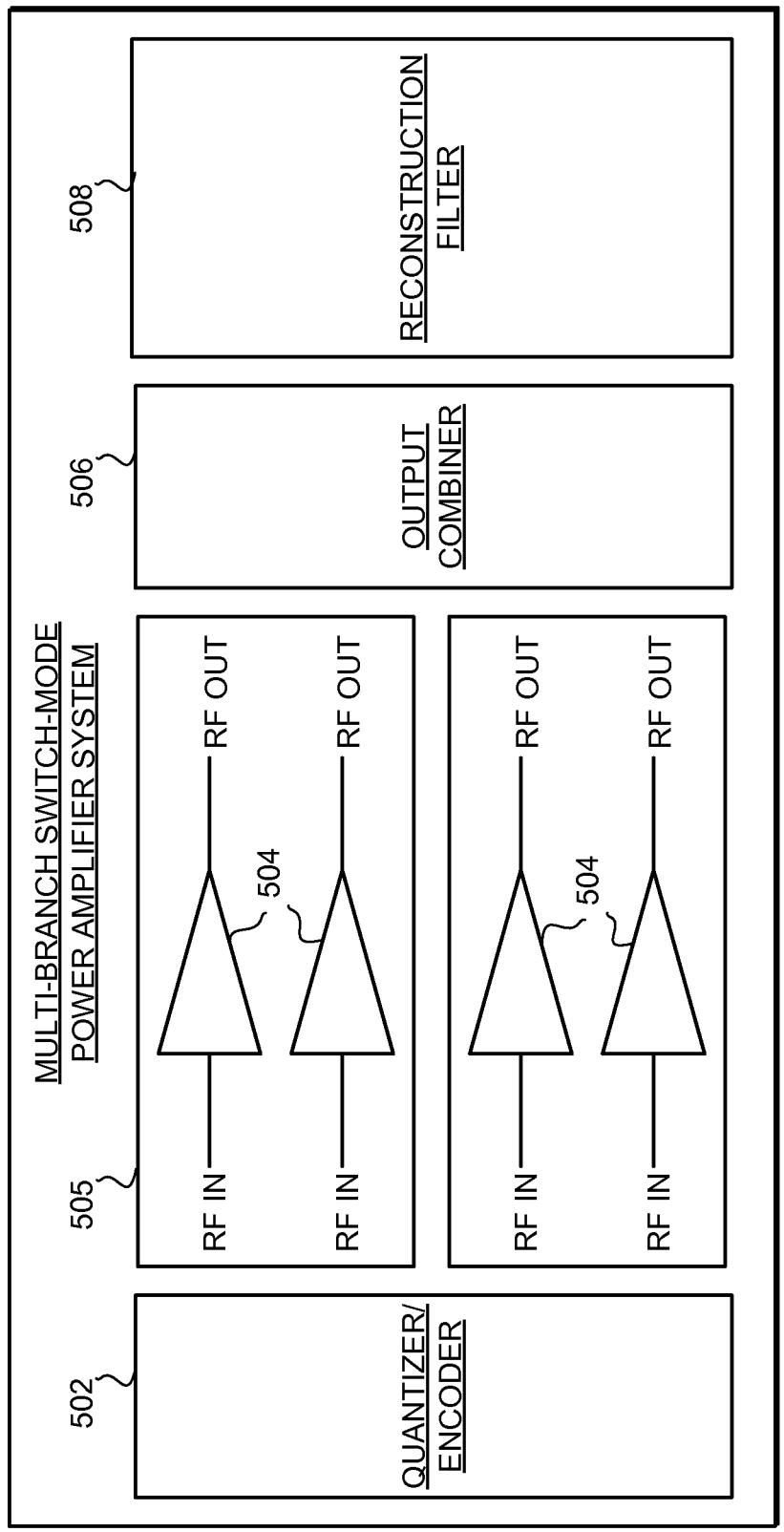
FIG. 5 is a simplified schematic diagram of a switch-mode power amplifier (SMPA) system, in accordance with an example embodiment.

The driver amplifiers illustrated in FIGS. 1-4 can be used in a variety of applications. As one specific example the driver amplifier can be used in a switch-mode power amplifier (SMPA). Turning now to FIG. 5, a schematic diagram of an exemplary SMPA system 500 is illustrated. The SMPA system 500 includes quantizer/encoder 502, four driver amplifiers 504, an output combiner 506, and a reconstruction filter 508. In general, the SMPA system 500 is configured to implement a digital-to-analog converter (DAC) function by amplifying RF signals. Specifically, the SMPA system 500 operates by quantizing an RF signal, using the quantized signal to drive multiple parallel SMPA branches, and combining the output of those parallel SMPA branches.

In the illustrated embodiment, the SMPA system 500 includes two branches 505, with each of the two branches 505 including two driver amplifiers 504 and two associated drive signal inputs. However, it should be noted that this is just one example, and that such an SMPA system 500 can be implemented with any number of such branches 505.

Each branch 505 is configured to receive a combination of drive signals from the quantizer/encoder 502 at the associated two drive signal inputs and produce an SMPA branch output signal. Specifically, each branch 505 is configured to produce different voltage levels at an associated SMPA branch output in response to different combinations of drive signal inputs. Thus, a first voltage level is produced in response to receiving a first combination of drive signals, and a second voltage level is produced in response to receiving a second combination of drive signals.

The SMPA branch output signals are passed to the output combiner 506. The output combiner 506 is configured to combine together the SMPA branch output signal from all of the SMPA branches to produce a combined output signal. The combined output signal is passed to the reconstruction filter 508 with the reconstruction filter 508 configured to filter the combined output signal.

In accordance with the embodiments described herein, each branch 505 includes driver amplifiers 504. Each such driver amplifier 504 includes an input node, an output node, a first transistor pair and a second transistor pair. The first transistor pair includes a first transistor in series with a second transistor, and the second transistor pair includes a third transistor in series with a fourth transistor. Each of the first, second, third and fourth transistors are an n-type transistor having a gate, source and drain.

Specifically, the first transistor is an n-type transistor having a first gate, first source and first drain, the second transistor is an n-type transistor having a second gate, second source and second drain, the third transistor is an n-type transistor having a third gate, third source and third drain, and the fourth transistor is an n-type transistor having a fourth gate, fourth source and fourth drain. The output node of each driver amplifier 504 is coupled to the first source and the second drain, while the input node is coupled to the second gate, third and gate and fourth gate, and where the first gate is coupled to the third source.

So configured each driver amplifier 504 includes two n-type transistor pairs arranged in a push-pull configuration. This push-pull configuration allows each driver amplifier 504 to alternatively supply current and absorb current from a load at the output without requiring any p-type transistors. Eliminating the need for p-type transistors can improve the high frequency bandwidth of the driver amplifier and its associated SMPA system 500.

As will be explained in greater detail below, such an SMPA system 500 can be used to amplify a time varying signal, such as a radio frequency (RF) signal. Essentially, the SMPA system 500 described herein implements an RF digital-to-analog converter (DAC) function. More specifically, the SMPA system 500 may be particularly suitable for use within a communication system in which an RF signal is oversampled and quantized prior to being encoded in order to drive multiple parallel branches 505. In such an embodiment each branch 505 is configured to convert a direct current (DC) input voltage into an amplified output signal based on the drive signals that are provided to SMPAs (e.g., transistors) of the branch 505. The SMPA system 500 further combines the output signals from the multiple branches 505 in order to produce an output RF signal with a voltage level that may be modulated between a plurality of voltage levels or states. The resulting output RF signal may be reconstructed with a reconstruction filter.

As will be explained in more detail below, the number, N, of SMPA "branches" utilized in the SMPA system 500 defines the number, M, of output signal quantization states. More specifically, the number, M, of output signal quantization states is equal to at least 2*N+1, in an embodiment. According to various embodiments, N may be any integer greater than 1, although N also (although potentially less usefully) could be as small as 1, as well. For example, when N=2, an embodiment of an SMPA system 500 is capable of producing an output signal having at least 5 distinct quantization states. Similarly, when N=3, an embodiment of an SMPA system 500 is capable of producing an output signal having at least 7 distinct quantization states, when N=4, an embodiment of an SMPA system 500 is capable of producing an output signal having at least 9 distinct quantization states, and so on. The number of SMPA branches 505 may be considered to be arbitrary. A higher number of branches 505 may be advantageous because it may result in higher coding efficiency. However, a system 500 with a higher number of branches 505 would be, by its nature, larger and more complex than a system with a lower number of branches 505. In any event, the inventive subject matter is intended to include embodiments of a system with any number of SMPA branches.

Figure 6:
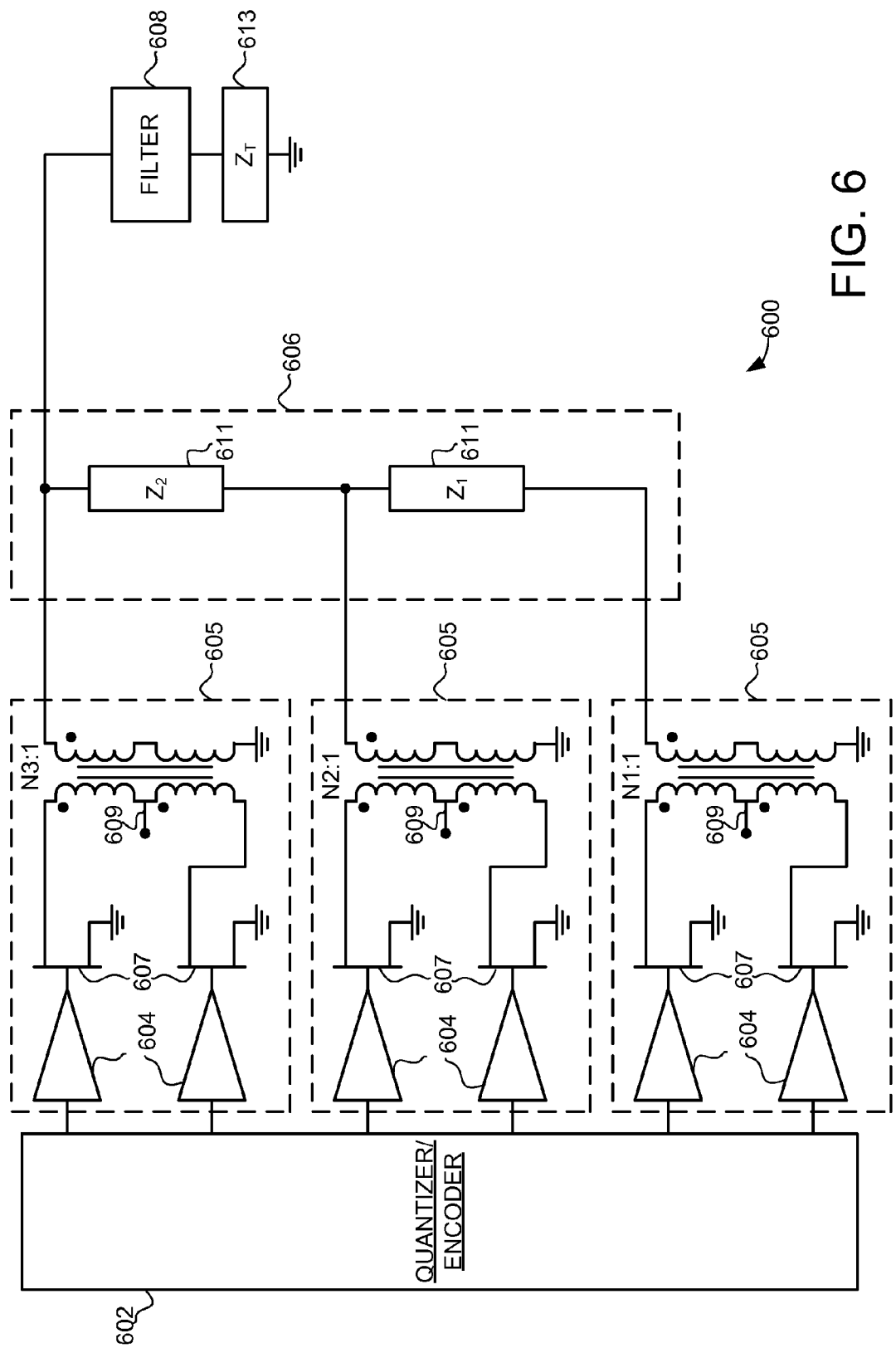
FIG. 6 is a simplified schematic diagram of multiple-state, SMPA system, in accordance with an example embodiment.

FIG. 6 illustrates a schematic diagram of multiple-state SMPA system 600, in accordance with an example embodiment. SMPA system 600 includes a quantizer/encoder (QE) module 602, three SMPA branches 605, an output combiner 606, and a reconstruction filter 608. As will be explained in more detail below, each SMPA branch 605 includes two driver amplifiers 604 and two transistors 607. Again, although FIG. 6 illustrates SMPA system 600 as including three SMPA branches 605 it is to be understood that other embodiments of SMPA systems may include more or less than three SMPA branches.

The operation of the SMPA system 600 will be discussed with reference to FIGS. 6-8. QE module 602 is configured to receive an RF input signal at an input node, and to sample the signal in order to produce a sequence of samples. For example, QE module 602 may be configured to periodically sample the magnitude of the voltage of the input RF signal and produce samples (at a sampling rate) that indicate the measured RF signal magnitudes. Alternatively, QE module 602 may be configured to sample the voltage of the input RF signal. Either way, QE module 602 is essentially configured to sample the input RF signal at the sampling rate. According to an embodiment, the sampling rate is higher than the fundamental frequency of the RF signal. More specifically, the sampling rate is selected to be high enough at least to satisfy the Nyquist sampling criterion. According to a specific embodiment, the sampling rate is about 4 times the fundamental frequency of the RF signal. In alternate embodiments, the sampling rate may be higher or lower (e.g., as low as twice the fundamental frequency). QE module 602 may perform the sampling, for example, using an analog-to-digital converter (ADC), such as a sigma-delta ADC, although other types of ADCs could be used, as well.

According to an embodiment, QE module 602 is further configured to quantize the samples within the sequence of samples in order to produce a sequence of quantized digital values, where the number of quantization states for the quantized digital values corresponds to the number of output signal quantization states (e.g., at least 2*N+1, in an embodiment). QE module 602 is further configured to encode each quantized digital value in order to produce a multi-bit encoded value in which each bit corresponds to a drive signal for a distinct one of the system's driver amplifiers 604. Accordingly, in system 600, which includes three SMPA branches 605 and six corresponding driver amplifiers 604, each encoded value may include at least six bits. The drive signals corresponding to each encoded value are provided substantially in parallel to the drive signal inputs of the SMPA branches 605. According to an embodiment, and as will be explained in more detail later, the drive signals may have phase offsets when provided to the drive signal inputs in order to compensate for phase shifts later applied by phase transformers in the combiner 606, and phase shifts arising within the output combiner 606, and the term "substantially in parallel" is intended to reflect that provision of the drive signals may be offset in phase.

Each SMPA branch 605 includes a complementary pair of driver amplifiers 604. Such driver amplifiers 604 can include any of the driver amplifiers described above with reference to FIGS. 1-4. Thus, each of the driver amplifiers 604 can utilize only n-type transistors. Using only n-type transistors in the driver amplifier can increase the operating bandwidth of the driver amplifier 604. In one embodiment, the driver amplifiers 604 include an input node coupled to an RF signal, an output node, a first transistor pair, and a second transistor pair. The first transistor pair includes a first transistor in series with a second transistor, and the second transistor pair includes a third transistor in series with a fourth transistor.

So configured the driver amplifiers 604 include two n-type transistor pairs arranged in a push-pull configuration. This push-pull configuration allows the driver amplifiers 604 to alternatively supply current and absorb current from a load at the output without requiring any p-type transistors.

In this embodiment, each driver amplifier 604 is coupled to a transistor 607. In one embodiment the transistors 607 is a transistor with a negative threshold voltage. In such an embodiment, the driver amplifier 604 can include an amplifier with level shifting, such as those illustrated in FIGS. 3 and 4. As one specific example, the transistors 607 can be high performance GaN transistors that employ negative threshold voltages.

Each SMPA branch 605 also includes a tapped transformer 609. According to an embodiment, each transformer 609 includes a center-tapped, first coil with a first terminal coupled to the drain of first of the transistors 607, and a second terminal coupled to the drain of a second of the transistors 607. In addition, each transformer 607 includes a second coil that is inductively coupled with the first coil, and includes first terminal coupled to an SMPA branch output, and a second terminal coupled to a voltage reference (e.g., ground). The turn ratio of each transformer 609 is selected to produce a desired output voltage at SMPA branch outputs. In addition, the input DC voltages are supplied to the SMPA branches at the center tap of the first coil of the transformer 609.

According to an embodiment, the transistor(s) of each driver amplifier 604 are not operated in the linear region, but rather are either operated in the saturation region (or switched completely "on") or inactive (or switched completely "off") via the drive signals supplied to the drive signal inputs. Furthermore, the voltage of the output signal produced at each SMPA branch 605 depends upon the states of the drive signals to the driver amplifiers 604 (i.e., the drive signals provided at drive signal inputs and the magnitude of the input DC voltage supplied through the voltage inputs). More specifically, in an embodiment, driver amplifiers 604 are driven so that either both driver amplifiers 604 in an SMPA branch 605 are essentially off, thus producing substantially zero voltage at an SMPA branch output, or one of the driver amplifiers 604 is essentially off while the other is operating in the saturation region (i.e., completely "on"), thus producing either a positive voltage signal or a negative voltage signal (depending on which driver amplifier 604 is being driven).

For ease of description, each drive signal (e.g., the signal provided at one of drive signal inputs) is described herein as having one of two voltage levels or states at any given time: 1) a first state, $S_{OFF}$, corresponding to a drive signal that will cause a transistor of a driver amplifier 604 to which it is supplied to be substantially non-conducting, or fully "off"; and 2) a second state, $S_{ON}$, corresponding to a drive signal that will cause a transistor of a driver amplifier 604 to which it is supplied to be operating in the saturation region, or substantially conducting, or fully "on." In addition, the voltage of each output signal (e.g., the voltage of each signal at an SMPA branch output) may be indicated with a normalized value, which indicates that the voltage is either: 1) substantially zero ("0"); 2) a positive voltage level ("1"); or 3) a negative voltage level ("−1"). Table 1, below, is a truth table indicating combinations of drive signal values supplied to two drive signal inputs of a single SMPA branch 605 and the corresponding normalized voltage output value that would be produced by the SMPA branch 605 at its SMPA branch output, according to an embodiment.

TABLE 1

Truth table for SMPA drive signals vs. normalized output voltage

| Drive signal 1 | Drive signal 2 | Normalized output voltage |
| --- | --- | --- |
| $S_{OFF}$ | $S_{OFF}$ | 0 |
| $S_{ON}$ | $S_{OFF}$ | 1 |
| $S_{OFF}$ | $S_{ON}$ | −1 |

As discussed previously, QE module 602 oversamples an input RF signal to produce a sequence of samples, quantizes each sample to produce a sequence of quantized digital values, and encodes each quantized digital value in order to produce a multi-bit encoded value in which each bit corresponds to a drive signal for a distinct one of the system's driver amplifiers 604. For example, for a six-bit encoded value, a first bit (e.g., the most significant bit (MSB)) may correspond to a drive signal for a first drive signal input, a second bit (e.g., the adjacent bit of lesser significance) may correspond to a drive signal for a second drive signal input and so forth. Other encoded value bit-to-drive signal mappings may also be used, although the above mapping will be used herein for the purpose of example.

During operation of system 600, the combination of drive signals provided by QE module 602 in parallel to drive signal inputs are defined by an encoded value that is next to be processed by the system 600. More specifically, for example, QE module 602 may generate a sample, quantize the sample to produce a quantized digital value, and convert the quantized digital value into a particular encoded value (e.g., a 6-bit value) that corresponds to the magnitude of the quantized digital value. QE module 602 may then generate the drive signals according to the encoded value.

As discussed previously, SMPA system 600 also includes an output combiner 606. The output combiner includes a plurality of inputs, each coupled to one of the SMPA branch 605 outputs. The output combiner 606 is configured to combine the signals received from the SMPA branches 605 in order to produce a combined output signal. The combined output signal is provided to reconstruction filter 608, in an embodiment, which includes a band-pass filter configured to bandlimit the combined output signal (e.g., to produce a smoother output analog RF signal by filtering out the out-of-band spectral content). When the reconstruction filter 608 is coupled to a load 613, as shown in FIG. 1, the reconstructed output signal produced by the reconstruction filter 608 is provided to the load 613.

According to an embodiment, output combiner 606 includes a number of phase transformers 611 which are coupled to combiner inputs. Typically, the number of phase transformers 611 may equal N−1, although the number of summing nodes 168, 169 and/or phase transformers 165, 166 may be different, in other embodiments.

Phase transformers 611 may be quarter wave (lambda/4) phase transformers, for example. Accordingly, each phase transformer 611 may introduce a 90 degree phase delay to a signal received at its first terminal. In other embodiments, phase transformers 611 may be configured to introduce larger or smaller phase delays. In addition to producing a phase shift, phase transformers 611 may also be configured to produce impedance transformations. Either way, the phasing of the drive signals provided to the SMPA branches 605 is controlled so that signals received at the phase transformers 611 will be added together in phase. In this manner, the output signals from all of the SMPA branches 605 ultimately are combined in phase with each other.

As will now be described in detail, embodiments of an SMPA system, such as SMPA system 600 described above, may be operated so that the SMPA system is capable of producing an output signal with a voltage level that may be modulated between a plurality of voltage levels or states. For example, in an SMPA system with N SMPA branches, the number, M, of output signal quantization states is equal to at least 2*N+1, in an embodiment. Each output quantization state corresponds to a different set of drive signals and, thus, to a different set of encoded values. In other words, according to an embodiment, a QE module (e.g., QE module 602) is configured to quantize each sample and thereafter encode each quantized digital value to one of M encoded values, and each of the M encoded values, when converted to drive signals, corresponds to production of an output signal having one of M output signal quantization states.

Figure 8:
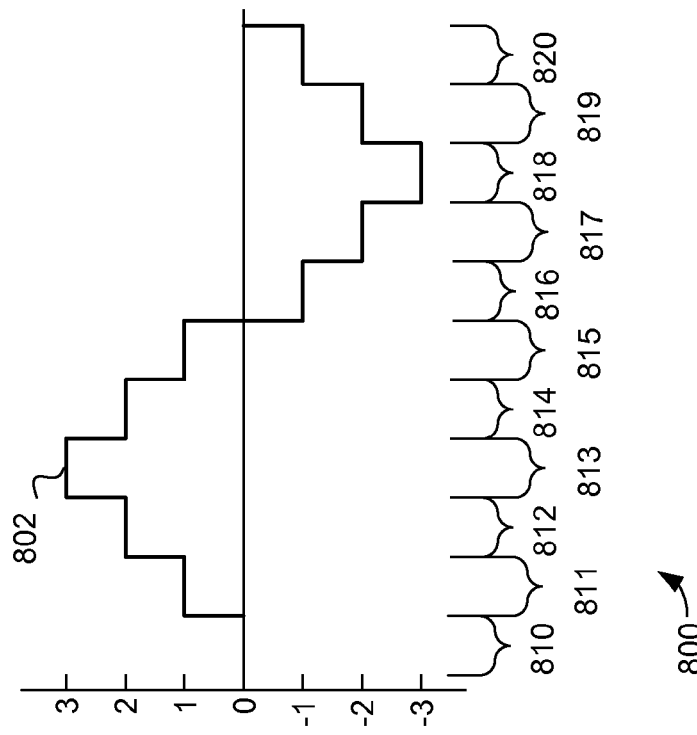
FIG. 8 is a chart illustrating seven example output voltage levels for a three-branch SMPA system that implements uniform quantization, in accordance with an example embodiment.
Figure 7:
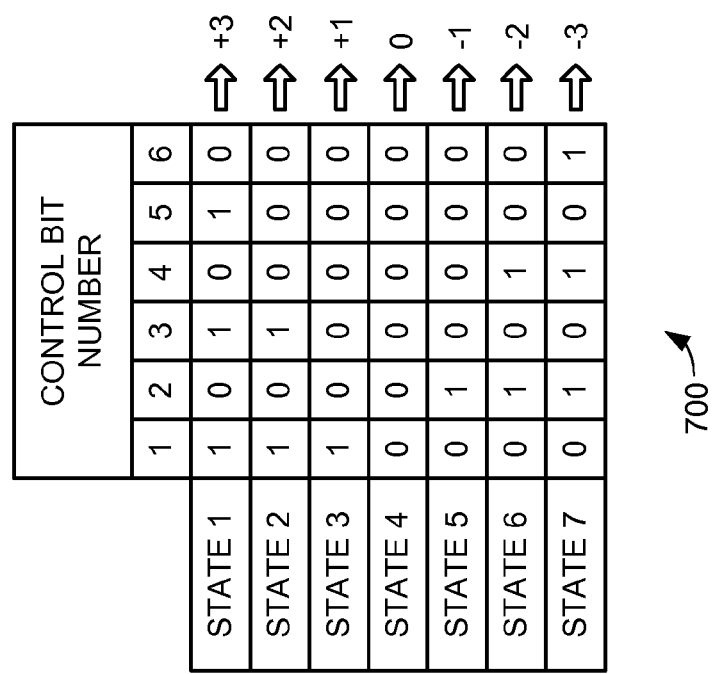
FIG. 7 is a table illustrating a first example of amplifier control bit codes that, when provided to an embodiment of a three-branch SMPA system, cause the SMPA system to amplitude modulate its output signal to one of seven output voltage levels.

For example, FIGS. 7-8 correspond to systems with three SMPA branches (i.e., N=3) which are configured to produce output signals having any one of seven output quantization states (i.e., M=2*3+1=7). More specifically, FIG. 7 is a chart 700 illustrating a first example of amplifier control bit codes which, when implemented in an embodiment of a three-branch SMPA system with six driver amplifiers, cause the SMPA system to amplitude modulate its output signal to one of seven output voltage levels or states.

Chart 700 includes seven rows, where each row corresponds to one of seven quantization states (e.g., quantization states ranging from values of −3 to +3 in step sizes of 1). In addition, the chart 700 includes six columns, where each column corresponds to one bit of a six-bit encoded value, and the value of each bit determines the state of a drive signal that will be provided to one of the six driver amplifiers of the system. Said another way, each bit position of an encoded value corresponds to a different one of the six driver amplifiers, and the value of the bit in that bit position defines the drive signal that the QE module will provide to the corresponding driver amplifier.

In the example embodiments provided herein, the least significant bits of each encoded value (i.e., control bits 1 and 2 in chart 700) correspond to the driver amplifiers that are electrically farthest from the output node, and the most significant bits of each encoded value (i.e., control bits 5 and 6 in chart 700) correspond to the driver amplifiers that are electrically closest to the output node. Those of skill in the art would understand, based on the description herein, that the mapping of bits in an encoded value to driver amplifiers of a system may be different from the example mappings provided herein, and such alternative mappings are intended to be included within the scope of the inventive subject matter.

In any event, referring to FIG. 7, each row includes one of seven unique encoded values, and each of the encoded values, when selected by the QE module and used to produce drive signals for the PAs, will cause the system to produce an output signal having one of seven different normalized voltage levels or states. For example, in chart 700, encoded value "1 0 1 0 1 0" may correspond to a highest quantization state (e.g., a positive voltage level of +3), encoded value "1 0 1 0 0 0" may correspond to a next highest quantization state (e.g., a positive voltage level of +2), encoded value "1 0 0 0 0 0" may correspond to a next highest quantization state (e.g., a positive voltage level of +1), encoded value "0 0 0 0 0 0" may correspond to a neutral or zero quantization state, encoded value "0 1 0 0 0 0" may correspond to a next lowest quantization state (e.g., a negative voltage level of −1), encoded value "0 1 0 1 0 0" may correspond to a next lowest quantization state (e.g., a negative voltage level of −2), and encoded value "0 1 0 1 0 1" may correspond to the lowest quantization state (e.g., a negative voltage level of −3).

As mentioned previously, a QE module periodically samples an input RF signal to produce a sequence of samples that are indicative of the voltage of the RF signal at each of the sampling times. The QE module further quantizes each sample to produce a corresponding quantized digital value, and selects an encoded value (e.g., one of the encoded values in chart 700) corresponding to each quantized digital value. After an encoded value has been selected, it may be converted into drive signals for driving the system's driver amplifiers. For example, each "0" in an encoded value may correspond to a drive signal having a magnitude of $S_{OFF}$, and each "1" in an encoded value may correspond to a drive signal having a magnitude of $S_{ON}$. The QE module may then provide the drive signals to the corresponding driver amplifiers (e.g., in a phased manner, as discussed previously).

According to an embodiment, SMPA system (e.g., system 600) may implement uniform quantization, meaning that an equal voltage difference exists between any two adjacent quantization states (e.g., a normalized value of 1).

FIG. 3 is a chart 800 illustrating seven example output voltage levels for a three-branch SMPA system that implements uniform quantization, in accordance with an example embodiment. In chart 800, the vertical axis represents voltage level (normalized), and the horizontal axis represents time. In keeping with the previous example, the chart 800 depicts a varying magnitude of an output signal when a particular sequence of encoded values (e.g., a sequence of values from the encoded values of FIG. 7) is selected by a QE module. Referring to both FIGS. 7 and 8, trace 802 of chart 800 depicts the magnitude of the output signal when a QE module (e.g., QE module 602) converts the sequence of encoded values in the following table into drive signals that are provided to SMPA branches (e.g., SMPA branches 605), each SMPA branch produces a corresponding output signal, and a combiner (e.g., combiner 606) combines the output signals to produce a combined output signal as illustrated in Table 2:

TABLE 2

| time period (FIG. 3) | row/encoded value (FIG. 2) | normalized output voltage |
|---|---|---|
| 810 | 0 0 0 0 0 0 | 0 |
| 811 | 1 0 0 0 0 0 | 1 |
| 812 | 1 0 1 0 0 0 | 2 |
| 813 | 1 0 1 0 1 0 | 3 |
| 814 | 1 0 1 0 0 0 | 2 |
| 815 | 1 0 0 0 0 0 | 1 |
| 816 | 0 1 0 0 0 0 | −1 |
| 817 | 0 1 0 1 0 0 | −2 |
| 818 | 0 1 0 1 0 1 | −3 |
| 819 | 0 1 0 1 0 0 | −2 |
| 820 | 0 1 0 0 0 0 | −1 |

In the above given example of table 2, uniform quantization is achieved in a system in which the output voltage increases or decreases uniformly (e.g., in uniform step sizes of 1 volt normalized) per the operation described in chart 700 (FIG. 7) when changing the input coding from one row to an adjacent row. In an alternate embodiment, uniform quantization may be achieved in a system in which other combinations of the SMPA branches may contribute to the output signal. More specifically, in such an embodiment, different combinations of SMPA branches may be driven to achieve the various voltage levels. Accordingly, in such an embodiment, different encoded values could be implemented to achieve the same results that were achievable using the encoded values from FIG. 7.

The encoded values in chart 800 are provided as examples only. Those of skill in the art would understand, based on the description herein, how to generate sets of encoded values that may be used in conjunction with various embodiments of SMPA systems in order to produce output signals having uniformly quantized output quantization states. In addition, those of skill in the art would understand, based on the description herein, how to generate sets of encoded values that may be used in conjunction with SMPA systems with more or fewer than three SMPA branches (e.g., SMPA systems that may produce output signals with more or fewer than seven states). For example, an embodiment of an SMPA system with four SMPA branches (i.e., N=4) may be capable of producing an output signal with at least nine voltage quantization states (i.e., M=2*4+1=9). In such an embodiment, a set of encoded values may include nine different eight-bit values in order to implement the nine different quantization states.

In one embodiment a radio frequency (RF) driver amplifier is provided that includes: an input node coupled to an RF signal; an output node; a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the output node is coupled to the first source and the second drain, and wherein the input node is coupled to the second gate; and a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the input node is coupled to the third gate and the fourth gate, and wherein the first gate is coupled to the third source.

In another embodiment an amplifier is provided, comprising: a number, N, of switch-mode power amplifier (SMPA) branches, wherein N is greater than one, and wherein each SMPA branch includes: two drive signal inputs, so that the amplifier has a total of 2*N drive signal inputs, one SMPA branch output, so that the amplifier has a total of N SMPA branch outputs, and two driver amplifiers, each driver amplifier coupled to one of the two drive signal inputs, and wherein each of the two driver amplifiers includes: a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the corresponding SMPA branch output is coupled to the first source and the second drain, and wherein one of the corresponding drive signal inputs is coupled to the second gate; and a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the one of the corresponding drive signal inputs is coupled to the third gate and the fourth gate, and wherein the first gate is coupled to the third source, and wherein, in response to receiving a first combination of drive signals at the two drive signal inputs, each SMPA branch is configured to produce, at the SMPA branch output, an SMPA branch output signal at a first voltage level, and in response to receiving a different second combination of drive signals at the two drive signal inputs, each SMPA branch is configured to produce, at the SMPA branch output, the SMPA branch output signal at a different second voltage level.

In another embodiment a method, performed by an amplifier, for amplifying a time varying signal is provided. The method comprising the steps of: receiving combinations of drive signals by a number, N, of switch-mode power amplifier (SMPA) branches of the amplifier, wherein N is greater than one, and wherein each SMPA branch includes two drive signal inputs, so that the amplifier has a total of 2*N drive signal inputs, and one SMPA branch output, so that the amplifier has a total of N SMPA branch outputs, and where each SMPA branch includes two driver amplifiers, each of the driver amplifiers including; a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the corresponding SMPA branch output is coupled to the first source and the second drain, and wherein one of the corresponding drive signal inputs is coupled to the second gate; and a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the one of the corresponding drive signal inputs is coupled to the third gate and the fourth gate, and wherein the first gate is coupled to the third source, and wherein, in response to receiving a first combination of drive signals at the two drive signal inputs, producing, by each SMPA branch at the SMPA branch output, an SMPA branch output signal at a first voltage level; and in response to receiving a different second combination of drive signals at the two drive signal inputs, producing, by each SMPA branch at the SMPA branch output, the SMPA branch output signal at a different second voltage level.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A radio frequency (RF) driver amplifier comprising:
an input node coupled to an RF signal;
an output node;
a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the output node is coupled to the first source and the second drain, and wherein the input node is coupled to the second gate;
a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the input node is coupled to the third gate and the fourth gate, and wherein the first gate is coupled to the third source; and
wherein the first transistor, the second transistor, the third transistor, and the fourth transistor all comprise enhancement mode devices.

2. The driver amplifier of claim 1, wherein the second source and the fourth source are each coupled to a voltage source and a first capacitor, with the first capacitor coupled to a first ground to provide AC ground through the first capacitor, and wherein the voltage source provides a negative DC bias with respect to the first ground.

3. The driver amplifier of claim 2, wherein the output node is coupled to an output transistor, and wherein the output transistor has a negative threshold voltage with respect to the first ground.

4. The driver amplifier of claim 1, wherein the driver amplifier is configured in a branch of a switch-mode power amplifier (SMPA) that includes a plurality of branches.

5. A radio frequency (RF) driver amplifier comprising:
an input node coupled to an RF signal;
an output node;
a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the output node is coupled to the first source and the second drain, and wherein the input node is coupled to the second gate;
a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the input node is coupled to the third gate and the fourth gate, and wherein the first gate is coupled to the third source;
a fifth transistor comprising an n-type transistor having a fifth gate, fifth source and fifth drain; and
a sixth transistor comprising an n-type transistor having a sixth gate, sixth source and sixth drain, and wherein:
the input node is coupled to the second gate by coupling the sixth gate to the input node and coupling the sixth drain to the second gate;
the input node is coupled to the third gate by coupling sixth drain to the fifth gate and coupling the fifth drain to the third gate; and
the input node is coupled to the fourth gate by coupling sixth drain to the fourth gate.

6. The driver amplifier of claim 5, wherein the first transistor, the second transistor, the third transistor, and the fourth transistor all comprise enhancement mode devices.

7. A radio frequency (RF) driver amplifier comprising:
an input node coupled to an RF signal;
an output node;
a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the output node is coupled to the first source and the second drain, and wherein the input node is coupled to the second gate;
a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the input node is coupled to the third gate and the fourth gate, and wherein the first gate is coupled to the third source;
a fifth transistor comprising an n-type transistor having a fifth gate, fifth source and fifth drain;
a sixth transistor comprising an n-type transistor having a sixth gate, sixth source and sixth drain;
a seventh transistor comprising an n-type transistor having a seventh gate, seventh source and seventh drain; and
an eighth transistor comprising an n-type transistor having a eighth gate, eighth source and eighth drain, and wherein
the input node is coupled to the second gate by coupling the sixth gate to the input node, coupling the sixth drain to the seventh gate, the seventh drain to the eighth gate, and the eighth drain to the second gate;
the input node is coupled to the third gate by coupling sixth drain to the fifth gate and coupling the fifth drain to the third gate; and
the input node is coupled to the fourth gate by coupling eighth drain to the fourth gate.

8. The driver amplifier of claim 7, wherein second source, the fourth source, the fifth source and the sixth source, the seventh source, and the eighth source are each coupled to a voltage source and a first capacitor, with the first capacitor coupled to a first ground to provide AC ground through the first capacitor, and wherein the voltage source provides a negative DC bias with respect to the first ground.

9. An amplifier comprising:
a number, N, of switch-mode power amplifier (SMPA) branches, wherein N is greater than one, and wherein each SMPA branch includes:
two drive signal inputs, so that the amplifier has a total of 2*N drive signal inputs,
one SMPA branch output, so that the amplifier has a total of N SMPA branch outputs, and
two driver amplifiers, each driver amplifier coupled to one of the two drive signal inputs, and wherein each of the two driver amplifiers includes:
a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the corresponding SMPA branch output is coupled to the first source and the second drain, and wherein one of the corresponding drive signal inputs is coupled to the second gate; and
a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the one of the corresponding drive signal inputs is coupled to the third gate and the fourth gate, and wherein the first gate is coupled to the third source, and wherein,
in response to receiving a first combination of drive signals at the two drive signal inputs, each SMPA branch is configured to produce, at the SMPA branch output, an SMPA branch output signal at a first voltage level, and
in response to receiving a different second combination of drive signals at the two drive signal inputs, each SMPA branch is configured to produce, at the SMPA branch output, the SMPA branch output signal at a different second voltage level.

10. The amplifier of claim 9, wherein each of the two driver amplifiers further comprises:
a fifth transistor comprising an n-type transistor having a fifth gate, fifth source and fifth drain;
a sixth transistor comprising an n-type transistor having a sixth gate, sixth source and sixth drain, and wherein:

the drive signal input is coupled to the second gate by coupling the sixth gate to the drive signal input and coupling the sixth drain to the second gate;

the drive signal input is coupled to the third gate by coupling sixth drain to the fifth gate and coupling the fifth drain to the third gate; and the drive signal input is coupled to the fourth gate by coupling sixth drain to the fourth gate.

11. The amplifier of claim 9, wherein for each of the two driver amplifiers the second source and the fourth source are each coupled to a voltage source and a first capacitor, with the first capacitor coupled to a first ground to provide AC ground through the first capacitor, and wherein the voltage source provides a negative DC bias with respect to the first ground.

12. The amplifier of claim 11, wherein for each of the two driver amplifiers the SMPA branch output is coupled to a corresponding output transistor, and wherein each corresponding output transistor has a negative threshold voltage with respect to the first ground.

13. The amplifier of claim 9, wherein each of the two driver amplifiers further comprises:

a fifth transistor comprising an n-type transistor having a fifth gate, fifth source and fifth drain;

a sixth transistor comprising an n-type transistor having a sixth gate, sixth source and sixth drain, a seventh transistor comprising an n-type transistor having a seventh gate, seventh source and seventh drain, an eighth transistor comprising an n-type transistor having a eighth gate, eighth source and eighth drain, and wherein the drive signal input is coupled to the second gate by coupling the sixth gate to the drive signal input, coupling the sixth drain to the seventh gate, the seventh drain to the eighth gate, and the eighth drain to the second gate;

the drive signal input is coupled to the third gate by coupling sixth drain to the fifth gate and coupling the fifth drain to the third gate; and the drive signal input is coupled to the fourth gate by coupling eighth drain to the fourth gate.

14. The amplifier of claim 13, wherein for each of the two driver amplifiers the second source, the fourth source, the fifth source and the sixth source, the seventh source, and the eighth source are each coupled to a voltage source and a first capacitor, with the first capacitor coupled to a first ground to provide AC ground through the first capacitor, and wherein the voltage source provides a negative DC bias with respect to the first ground.

15. The amplifier of claim 9, wherein the first transistor, the second transistor, the third transistor, and the fourth transistor all comprise enhancement mode devices.

16. The amplifier of claim 9, further comprising:

a combiner with N combiner inputs and a combiner output, wherein each of the combiner inputs is coupled to a different one of the N SMPA branch outputs, and the combiner is configured to combine together the SMPA branch output signal from all of the N SMPA branches to produce, at the combiner output, a combined output signal.

17. The amplifier of claim 16, wherein the combiner is configured to produce the combined output signal as a signal that is, at any given time, at one of 2*N+1 quantization states.

18. The amplifier of claim 16, wherein the combiner comprises:

N−1 summing nodes, wherein an output summing node of the N−1 summing nodes is coupled to the combiner output; and N−1 phase transformers, wherein each phase transformer is coupled to a summing node and is also coupled between SMPA branch outputs of a different set of two adjacent SMPA branches, and wherein the phase transformer is configured to apply a phase delay to the SMPA branch output signal from the SMPA branch that is electrically farther from the output summing node so that the SMPA branch output signals from the two adjacent SMPA branches combine in phase at the summing node to which the phase transformer is coupled.

19. The amplifier of claim 16, wherein the combiner comprises:

a reconstruction filter coupled to the combiner output, wherein the reconstruction filter is configured to bandpass filter the combined output signal.

20. A method, performed by an amplifier, for amplifying a time varying signal, the method comprising the steps of:

receiving combinations of drive signals by a number, N, of switch-mode power amplifier (SMPA) branches of the amplifier, wherein N is greater than one, and wherein each SMPA branch includes two drive signal inputs, so that the amplifier has a total of 2*N drive signal inputs, and one SMPA branch output, so that the amplifier has a total of N SMPA branch outputs, and where each SMPA branch includes two driver amplifiers, each of the driver amplifiers including;

a first transistor pair, the first transistor pair comprising a first transistor in series with a second transistor, the first transistor comprising an n-type transistor having a first gate, first source and first drain, the second transistor comprising an n-type transistor having a second gate, second source and second drain and wherein the corresponding SMPA branch output is coupled to the first source and the second drain, and wherein one of the corresponding drive signal inputs is coupled to the second gate; and a second transistor pair, the second transistor pair comprising a third transistor in series with a fourth transistor, the third transistor comprising an n-type transistor having a third gate, third source and third drain, the fourth transistor comprising an n-type transistor having a fourth gate, fourth source and fourth drain, and wherein the one of the corresponding drive signal inputs is coupled to the third gate and the fourth gate, and wherein the first gate is coupled to the third source, and wherein, in response to receiving a first combination of drive signals at the two drive signal inputs, producing, by each SMPA branch at the SMPA branch output, an SMPA branch output signal at a first voltage level; and in response to receiving a different second combination of drive signals at the two drive signal inputs, producing, by each SMPA branch at the SMPA branch output, the SMPA branch output signal at a different second voltage level.

* * * * *